United States Patent [19]

Le Can et al.

[11] 4,183,037

[45] Jan. 8, 1980

[54] SEMICONDUCTOR DEVICE

[75] Inventors: Claude J. P. F. Le Can, Nijmegen; Cornelis M. Hart; Hendricus E. J. Wulms, both of Eindhoven, all of Netherlands

[73] Assignee: U.S. Philips Corporation, New York, N.Y.

[21] Appl. No.: 847,723

[22] Filed: Nov. 2, 1977

[30] Foreign Application Priority Data

Jan. 17, 1977 [NL] Netherlands .................. 7700420

[51] Int. Cl.² ............................................ H01L 27/04
[52] U.S. Cl. .................................... 357/44; 357/59;
357/71; 357/92
[58] Field of Search ................... 354/40, 35, 92, 59, 354/71, 44

[56] References Cited

U.S. PATENT DOCUMENTS

| | | | |
|---|---|---|---|
| 3,525,020 | 8/1970 | Schmitz | 357/45 |
| 4,056,810 | 11/1977 | Hart et al. | 357/35 X |
| 4,078,208 | 3/1978 | Hart et al. | 357/92 X |
| 4,109,275 | 8/1978 | Sarkary | 357/71 X |

Primary Examiner—James W. Davie
Attorney, Agent, or Firm—Thomas A. Briody; Edward J. Connors, Jr.; James J. Cannon, Jr.

[57] ABSTRACT

The invention relates to a semiconductor device in which a crossing connection is realized by using parts of a layer of refractory conductive material already present for masking as a part of a current conductor separated from a crossing conductor by an insulation layer. The mask of refractory material may also define the regions in which switching transistors are realized. The invention results in important advantages, in connection with density and crossing connections, in particular in I²L-circuits.

9 Claims, 15 Drawing Figures $Q_1 = \overline{A+C+D}$
$Q_2 = \overline{C+D}$

SEMICONDUCTOR DEVICE

BACKGROUND OF THE INVENTION

1. Field of the Invention

This invention relates to a semiconductor device having a semiconductor body, comprising a surface-adjoining region of the first conductivity type, a current conductor of which at least a part comprises a surface-adjoining strip-shaped semiconductor zone of the second conductivity type, and, on at least one side of the strip-shaped semiconductor zone, at least one surface-adjoining further zone of the second conductivity type which is separated from the strip-shaped semiconductor zone by a part of the region of the first conductivity type and which forms part of a semiconductor circuit element, in which, in order to reduce the voltage drop across the current conductor as much as possible, the strip-shaped semiconductor zone, in as far as it forms part of said part of the current conductor, is covered substantially throughout its surface by a metal layer and is contacted with said metal layer at least at the ends of the current conductor, in which at least one conductor track, crosses the said part of the current conductor and the said metal layer is interrupted at the area of the crossing, the resulting parts of the metal layer contacting the strip-shaped semiconductor zone at least at their ends. The invention also relates to a method of manufacturing such a semiconductor device.

"End" should not be understood to mean the strictly goemetric end of the current conductor or of parts of the metal layer, but regions of said semiconductor and metal layer, respectively, in the proximity of said goemetric end. It will also be obvious that the current conductor may form part of a larger assembly, for example a conductor track, in which the voltage drop in the regions outside the current conductor meant here is bound to less stringent requirements.

2. Description of the Prior Art

A semiconductor device as described above is known, for example, from U.S. Pat. Nos. 4,056,810 and U.S. Pat. No. 4,078,208, the contents of which should be deemed to be incorporated in the present application.

The said Patent describes a semiconductor device comprising a surface-adjoining region of the first conductivity type, a current conductor comprising a surface-adjoining strip-shaped semiconductor zone of the second conductivity type and several surface-adjoining further zones of the second conductivity type which are separated from the strip-shaped semiconductor zone by a part of the region of the first conductivity type. The strip-shaped semiconductor zone, the intermediate region and the further zones serve in the said patent as an emitter, base and collector of a lateral transistor. Said transistor (injector) ensures the current supply for a number of vertical transistors the bases of which constitute the collectors of the injector. Moreover, each of the vertical transistors can comprise several collectors; herewith circuits of the so-called integrated injection logic type are realized.

For the sake of a uniform current supply of the said vertical transistors throughout the length of the strip-shaped semiconductor zone, it is therefore desired that said strip-shaped semiconductor zone should have a constant potential within very narrow tolerances. However, said semiconductor zone has a certain resistance; the sheet resistance of such a semiconductor zone may be, for example, 200 ohms per square. Since said strip-shaped semiconductor zone may be very long and should be capable of supplying current to many of the above vertical transistors, an undesired potential drop can easily occur in said strip-shaped zone. As a result of this, the voltage between the strip-shaped semiconductor zone and the region of the first conductivity type is no longer constant and irregular current supply to the vertical transistors may occur so that the switching behaviour of the said transistors is adversely influenced.

This drawback has been partly mitigated in the above-mentioned patents by covering the strip-shaped semiconductor zone with a metal layer which contacts said strip-shaped semiconductor zone over substantially the whole length of the semiconductor zone. The current conductor formed in this manner has a resistance which is considerably lower than that of the strip-shaped semiconductor zone alone. As a result of this, the voltage drop in the case of current supply is considerably reduced.

Although this measure is already an important improvement, not all the drawbacks have been removed herewith.

In the case of large numbers of circuit elements within one semiconductor device it is actually often necessary to provide conductive connections which cross a current conductor as mentioned above. For this purpose it is necessary to interrupt the metal layer above the strip-shaped semiconductor zone at the area of the crossing so that the current conductor at the area of the crossing consists exclusively of the strip-shaped semiconductor zone.

Although this is the case only over a short distance, the resulting higher resistance at the crossing nevertheless gives rise in many cases to an unacceptably large voltage drop along the strip-shaped semiconductor zone.

Of course the said problems may present themselves also in other types of circuits, in which current conductors are used which comprise semiconductor zones coated with a metal layer and which are crossed by other conductor tracks described, for example, in U.S. Pat. No. 3,525,020, and in general in all cases in which the voltage drop along similar current conductors should be extremely small.

One of the objects of the invention is to avoid the above-mentioned drawbacks entirely or at least as much as possible.

SUMMARY OF THE INVENTION

The invention is inter alia based on the recognition of the fact that the metal layer present on the strip-shaped semiconductor zone can be replaced, at least at the area of the crossing, in a very efficacious manner by another conductive layer which has already been provided in the device for quite different purposes and which interconnects two successive metal layers provided on the strip-shaped semiconductor zones without contact with the crossing conductor track occurring.

The invention is therefore characterized in that the current conductor comprises an uninterrupted layer of a refractory conductive material which entirely covers the region of the first conductivity type between the strip-shaped zone and the further zone of the second conductivity type and is separated therefrom by an electrically insulating layer, the edges of the layer of refractory conductive material in projection coinciding substantially with at least one edge of the strip-shaped semiconductor zone and with the oppositely located edge of the further semiconductor zone, the layer of the refractory conductive material, at the area of the crossing, being conductively connected to the metal layer on both sides of the crossing and being separated from the crossing conductor track by an insulating layer.

"Refractory" material is to be understood to mean herein a material which is not attacked at the temperatures used during the manufacture of the said semiconductor device and after providing said material.

The refractory material essentially has a double function. On the one hand it serves as a low-ohmic connection between the metal layers present on either side of the crossing. On the other hand, during the manufacture of the device it also serves as a masking for providing the strip-shaped semiconductor zone and the further semiconductor zone of the second conductivity type, by which masking the strip-shaped semiconductor zone and the further semiconductor zone are provided in a self-registering manner with respect to each other. The substantial coincidence of the edges of the refractory material with the edges of the strip-shaped zone and the further zone should be regarded in this light. Although in plan view the region of the doping is bounded by the edge of the refractory material, the doped zone can expand slightly by means of lateral diffusion during said doping or at a later instant in the manufacture of the device. The refractory material is preferably polycrystalline silicon because the use hereof presents considerable technological advantages. Other materials which have the desired properties can also be used advantageous for this purpose, for example, materials comprising one or more of the metals from the group molybdenum, tungsten and platinum.

As regards the above-mentioned parts of the metal layer it may be said that they have a substantially constant potential throughout their length. When the underlying strip-shaped semiconductor zone is contacted only at the ends (or possibly also in one or more points inbetween), an undesired potential drop may occur between said contacting points in the strip-shaped semiconductor zone in some cases as a result of the internal resistance of the strip-shaped semiconductor zone, for example, when the pn-junction between the strip-shaped semiconductor zone of the second conductivity type and the adjoining region of the first conductivity type is in the forward direction and injects charge carriers in the region of the first conductivity type. In order to remove the drawback, a preferred embodiment of the invention is therefore characterized in that the metal layer contacts the strip-shaped semiconductor zone substantially throughout its length.

The mask formed by the refractory material can advantageously define entirely the further zone of the second conductivity type and hence also cover the region of the first conductivity type between said zone and possible other further zones of the second conductivity type.

Since mask is advantageous, it is not removed thereafter but is maintained in the semiconductor device, and in connection herewith a further preferred embodiment of the invention is characterized in that the refractory material constitutes one coherent layer which is present above substantially the whole region of the first conductivity type. This permanent mask of conductive material is used advantageously. As a matter of fact, a number of parallel current paths are formed herewith at the area of the above-mentioned crossing so that the voltage drop at the area of the crossing becomes still smaller.

For the sake of the compactness of the semiconductor device it is desired to give both the strip-shaped semiconductor zone of the second conductivity type and the region of the first conductivity type present between the strip-shaped semiconductor zone and the further zone(s) of the second conductivity type a minimum width, in particular in complex circuits in which further zones of the second conductivity type are situated on both sides of the strip-shaped semiconductor zone. A further preferred embodiment is therefore characterized in that the semiconductor body comprises on both sides of the strip-shaped semiconductor zone of the second conductivity type further zones of the second conductivity type which are separated from the strip-shaped semiconductor zone and from each other by parts of the region of the first conductivity type, and that the current conductor comprises two uninterrupted layers of a refractory conductive material on both sides of the strip-shaped semiconductor zone which cover entirely the regions of the first conductivity type between the edges of the strip-shaped semiconductor zone and the edges of the further zones of the second conductivity type.

The invention is particularly suitable for the manufacture of semiconductor devices having circuits according to the integrated injection logic type ($I^2L$). Therefore a further preferred embodiment is characterized in that the strip-shaped zone forms the emitter zone, the further zones from the collector zone and the parts of the region of the first conductivity type situated between the strip-shaped zone and the further zones form the base zones of lateral injection transistors of a circuit according to the integrated logic principle, the further zones of the second conductivity type also forming the base zones of the switching transistors.

In these semiconductor devices having $I^2L$ circuit elements, the p-n-junction formed by the strip-shaped semiconductor zone of the second conductivity type and the adjoining region of the first conductivity type is operated in the forward direction. This means that in places where no current supply to switching transistors is necessary, as this is the case, for example, outside the region where the current conductor is situated opposite to a further zone of the second conductivity type, said p-n-junction unnecessarily dissipates power. This can be avoided in a suitable manner by the present invention by causing the refractory layer to continue in said places but omitting the strip-shaped semiconductor zone. Therefore, a further preferred embodiment of the invention is characterized in that the strip-shaped semiconductor zone is lacking at least partly outside the region where the current conductor is situated opposite to a further zone of the second conductivity type.

The invention furthermore comprises a particularly suitable method of manufacturing semiconductor devices as described above. According to the invention is is characterized in that the starting material is a semiconductor body having a surface-adjoining region of the first conductivity type, that a layer of electrically insulating material is provided on the surface, that a layer of refractory conductive material is provided on the insulating layer, that the layer of refractory conductive material is given the desired pattern, said layer being removed at the area of the strip-shaped zone to be provided and of the further zones, that the strip-shaped zone and the further zones of the second conductivity type are then provided by doping with a dopant causing the second conductivity type while using masking by the refractory conductive material, that a metal layer is provided in contact with at least the ends of the strip-shaped zone and with the refractory conductive material, and that, at least at the area of the crossing, the layer of refractory conductive material is covered with an electrically insulating layer, after which the crossing conductor track is provided on said insulating layer.

BRIEF DESCRIPTION OF THE DRAWINGS

The invention will now be described in greater detail with reference to a few embodiments and the drawing, in which FIG. 4 is a diagrammatic cross-sectional view of the semiconductor device shown in FIG. 1 taken on the taken on the line IV—IV, while

DESCRIPTION OF THE PREFERRED EMBODIMENTS

Figure 1:
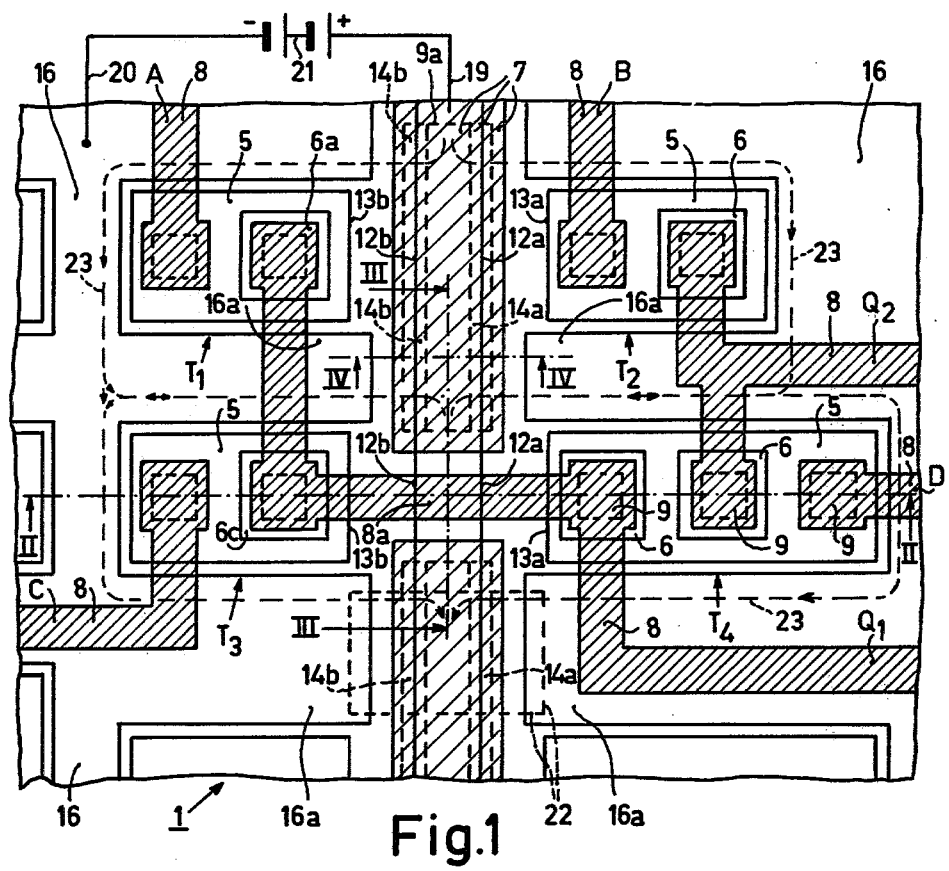
FIG. 1 is a plan view of a semiconductor device according to the invention.

The figures are diagrammatic and not drawn to scale. In particular, for reasons of clarity, the dimensions in the direction of thickness are strongly exaggerated in the cross-sectional views. Semiconductor regions of the same conductivity type are generally shaded in the same direction in the cross-sectional views. In the Figures further corresponding parts are as a rule referred to by the same reference numerals.

In the cross-sectional views, the semiconductor regions are drawn as being rectangular. In practice, however, they will show rounding-off, notably when said regions are provided by diffusion or when the device is subjected to thermal treatment at a later time.

As already noted above, the edges of the semiconductor zones 4 and 5 will in general not exactly coincide with the edges of the refractory material. However, in order to emphasize the aspect of self-registration, they are shown in the figures as being coincident.

Figure 2:
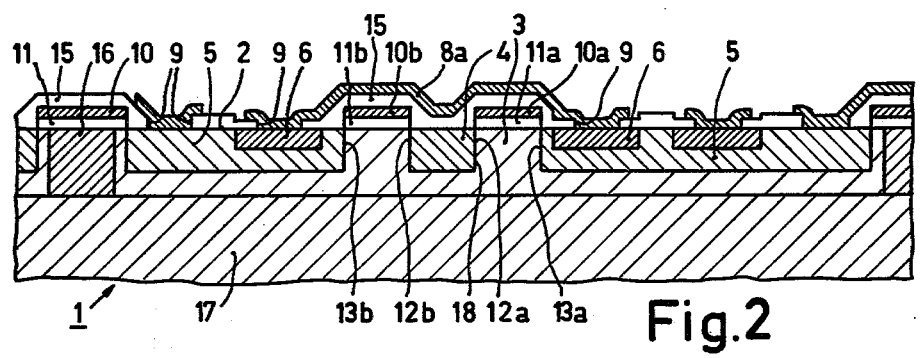
FIG. 2 is a diagrammatic cross-sectional view of the semiconductor device shown in FIG. 1 taken on the line II—II.
Figure 3:
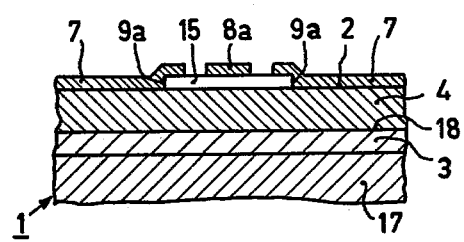
FIG. 3 is a diagrammatic cross-sectional view of the semiconductor device shown in FIG. 1 taken on the line III—III.
Figure 4:
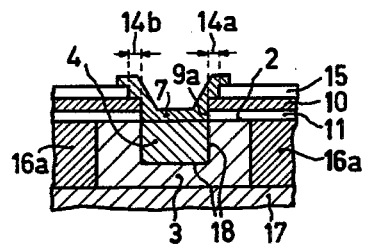

FIG. 1 is a plan view and FIGS. 2 to 4 are diagrammatic cross-sectional views taken on the lines II—II, III—III and IV—IV of FIG. 1 of a semiconductor device according to the invention. The device (see FIGS. 1 to 3) has a semiconductor body 1 which comprises a region 3 of the first conductivity type, in this example of the n-conductivity type, adjoining the surface 2. The body furthermore comprises a current conductor which comprises a strip-shaped semiconductor zone 4 (FIGS. 2, 3) of the second conductivity type, so in this case the p-conductivity type. On at least one side of the strip-shaped zone 4 the device furthermore comprises at least one further zone 5 (FIGS. 1, 2) also of the p-type, which adjoins the surface 2 and which is separated from the strip-shaped zone 4 by a part of the n-type region 3. In this example several of said further zones 5 are shown which form part of switching transistors. The example shows a circuit of the integrated injection logic type. The strip-shaped zone constitutes the emitter zone, the further zones 5 constitute the collector zones and the part of the region 3 situated between the strip-shaped zone 4 and the further zones 5 constitutes the base zones of lateral injection transistors. The zones 5 also form the base zone of vertical switching transistors in which n-type collector regions 6 (FIGS. 1, 2) are provided. The surrounding n-type region 3 also forms the common emitter zone of said switching transistors. In order to reduce the voltage drop along the conductor as much as possible, the strip-shaped semiconductor zone 4, in so far as it forms part of the current conductor meant here, is covered over substantially its entire surface with a metal layer 7 (FIGS. 1, 3 and 4) and is contacted with said metal layer at least at the ends of the current conductor. The circuit furthermore comprises at least one conductor track 8a (FIGS. 1 to 3) which crosses the current conductor. For this purpose, the metal layer 7 is interrupted at the area of said crossing, the resulting parts of the metal layer being connected, via contact holes 9a, at least at their ends to the strip-shaped semiconductor zone 4 (FIGS. 1, 3). In this example the metal layer 7 is in contact, substantially over its entirely length, with the strip-shaped zone 4 via the contact hole 9a.

According to the invention the current conductor furthermore comprises an uninterrupted layer 10a, 10b (FIGS. 2, 4) of a refractory conductive material which entirely covers the region 3 between the strip-shaped zone 4 and the further zone 5 and is separated therefrom by an electrically insulating layer 11a, 11b (FIG. 2).

In this example the insulating layer 11a, 11b consists of silicon oxide, while polycrystalline silicon has been chosen for the refractory material. The edges of said layer 10a, 10b of polycrystalline silicon in projection substantially coincide with at least one edge 12a, 12b (FIGS. 1, 2) of the strip-shaped semiconductor zone and with the oppositely located edge 13a, 13b (FIGS. 1, 2) of each further zone 5.

Figure 6:
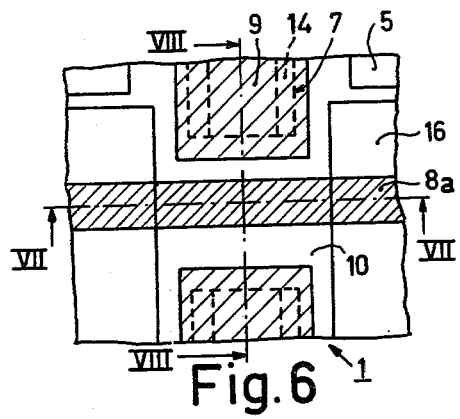
FIG. 6 is plan view of a part of the device shown in FIG. 1 according to another embodiment of the invention.

Finally, at the area of the crossing, said layer 10a, 10b of polycrystalline silicon is conductively connected to the metal layer 7 on both sides of the crossing, in this example via contacts 14a, 14b (FIGS. 1, 4), and separated from the crossing conductor track 8a by an insulating layer 15 (FIGS. 2, 3) of, for example, silicon oxide. At the area of the crossing, the current conductor consists of the strip-shaped zone 4 and of the polycrystalline silicon layer parts 10a, 10b, which are connected electrically in parallel with the zone 4 and thus reduce the electrical resistance of the current conductor at the area of the crossing. The contacts 14a, 14b in this example are provided substantially throughout the length of the current conductor. In this example the conductor track 8a forms part of a metallization pattern 8 which is connected, via contact holes 9, to exposed parts of the further zones 5 and the collector zones 6 so as to realize a circuit of the I²L type. FIG. 6 shows the electrical equivalent of said circuit.

Instead of polycrystalline silicon as a refractory conductive material, other materials which are not attacked at the temperatures used during the manufacture of the semiconductor device may in certain circumstances be used advantageously, for example material which comprises an element of the group of molybdenum, tungsten and platinum.

Furthermore, low-ohmic zones 16 (FIGS. 1, 2) which continue down to a substrate 17 situated below the region 3 (FIGS. 2 to 4) are provided between the various circuit elements.

Figure 7:
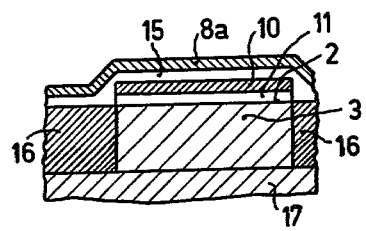
FIG. 7 is a diagrammatic cross-sectional view of the embodiment shown in FIG. 6 taken on the line VII—VII.
Figure 8:
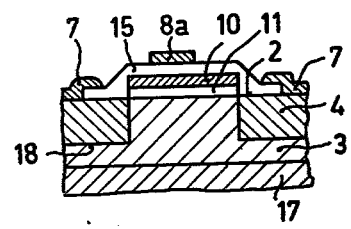
FIG. 8 is a diagrammatic cross-sectional view of the embodiment shown in FIG. 6 taken on the line VIII—VIII.
Figure 12:
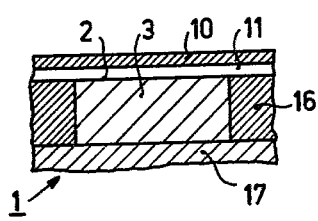
FIGS. 12 to 14 are diagrammatic cross-sectional views taken on the line IV—IV of a semiconductor device according to the invention in successive stages of manufacturing.

In this example, further zones 5 are present in the semiconductor body on both sides of the strip-shaped zone 4 and are separated from each other by parts of the FIG. 6 is the plan view of such a device while FIGS. 7 and 8 are cross-sectional views taken on the lines VII—VII and VIII—VIII, respectively.

The refractory conductive material 10 has now become one cohering assembly at the area of the crossing. As will be described in detail hereinafter, said refractory material serves not only as a part of the current conductor but also as a doping mask during the manufacture of the devices described here. A result of this is that the strip-shaped zone 4 is now interrupted.

The refractory conductive material may now advantageously be used as a doping mask for the whole device and may also define the other edges of the further zones 5, after which said refractory conductive material is maintained in the device and forms one cohering layer which is present above substantially the whole n-type region 3.

As an additional advantage, current paths 23 extending electrically parallel to the current conductor and further zones 5 are to be provided, and in this example the underlying oxide is also removed. Through the apertures thus obtained, the underlying zones are provided by doping. In this example, boron is diffused, for example, to a depth of 2.5 µm, the sheet resistance being, 200 Ohm per square.

Figure 13:
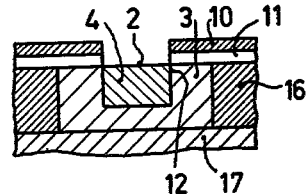
Figure 10:
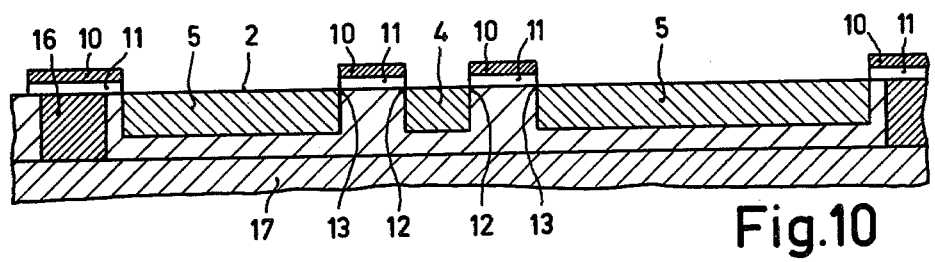

FIGS. 10 and 13 show the configuration thus obtained. The regions 5 are provided in a self-registering manner with respect to the strip-shaped zone 4 and with respect to each other by means of the mask of oxide and polycrystalline silicon, while the region 3 between the zone 4 and the further zones 5 is covered entirely by the polycrystalline silicon. Said masking layer of oxide and polycrystalline silicon is not removed from the device; in a subsequent step a layer 15 of silicon oxide is provided in a thickness of, for example, 0.5 µm, for example by thermal oxidation of the polycrystalline silicon or by gaseous-phase deposition.

Collector zones 6 are then provided in the usual manner, for example, by local diffusion of phosphorus down to a depth of approximately 1.5 µm with a sheet resistance of 5 ohms per square.

Figure 14:
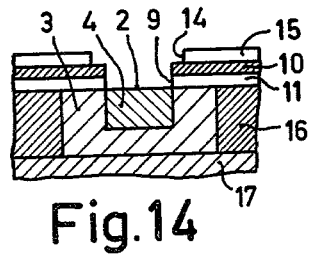
Figure 9:
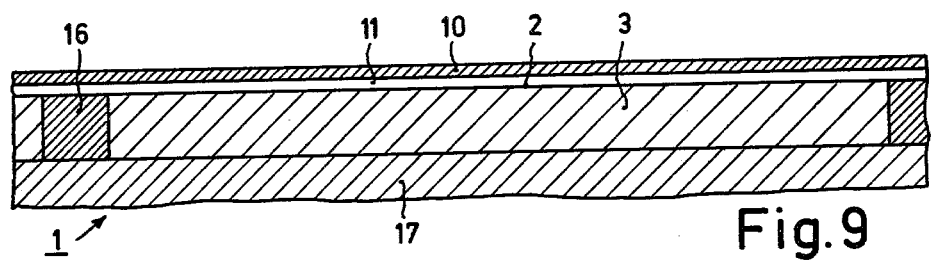
FIGS. 9 to 11 are diagrammatic cross-sectional views taken on the line II—II of a semiconductor device according to the invention in successive stages of manufacture.
Figure 11:
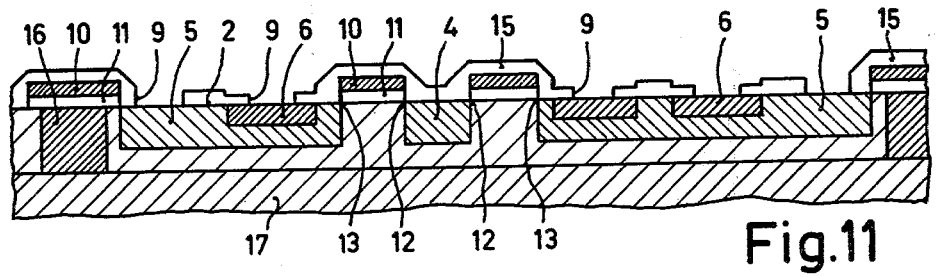

After providing the contact holes 9, 14 (FIGS. 11, 14) a metallization pattern 7, 8 is provided, for example, by vapour deposition and then etching a layer of aluminium after which the cross-sections as shown in FIGS. 2 to 4 are obtained.

The metal layer 7 then adjoins the strip-shaped zone 4 via contact holes 9 and adjoin the layer of polycrystalline silicon 10 via contact holes 14. At the area of the crossing said metal layer 7 is interrupted and the device is covered with the insulating layer 15 on which the conductor track 8a is provided in a crossing manner by means of said metallisation pattern.

It will be obvious that the invention is not restricted to the above given examples. Many variations are possible to those skilled in the art without departing from the scope of this invention. For example, the semiconductor material need not necessarily be silicon but other semiconductor materials may also be used, for example, germanium and semiconductor materials of the III–V type, for example, gallium arsenide. The conductivity of all the zones and regions may also (simultaneously) be replaced by their opposite conductivity types.

Figure 4A:
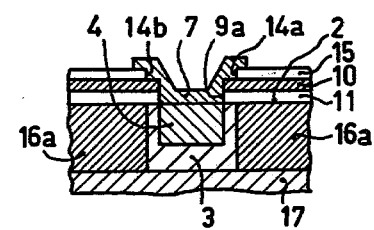
FIG. 4a shows a variation hereof.
Figure 5:
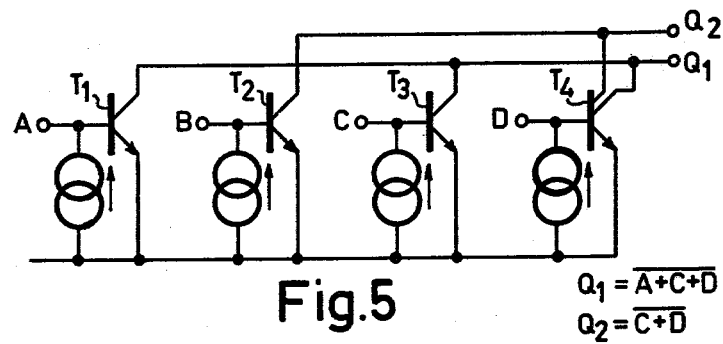
FIG. 5 shows the circuit diagram of the device shown in FIG. 1.

Alternatively, for example, several conductor tracks may cross the current conductor at the area of the crossing. The parts 16a of the low-ohmic zone 16 shown in FIG. 1 transversely to the current conductor may continue, if desired, to below the metal layer 7 covering the strip-shaped zone, so that the circuit becomes even more compact. The cross-sectional view taken on the line IV—IV then becomes as shown in FIG. 4a.

The strip-shaped zone 4 and the further zones 5, as well as the collector zones 6, may also be provided by means of ion implantation instead of by diffusion. Since said processes are usually carried out at lower temperatures then those at which diffusion processes take place, it will in this case be possible to use as a refractory material materials having a lower resistance to heat.

When polycrstalline silicon is used, said layer 10 may also be doped both during doping the zones 4, 5 and during doping the zones 6, so as to reduce the resistivity.

In devices in which the refractory conductive material is also to be used as an interconnection pattern, said refractory material may be etched to the desired pattern after doping the strip-shaped semiconductor 4 and the further zones 5; the layers of refractory material above the region 3 between the strip-shaped zones 4 and the further zone 5 should be electrically insulated entirely from said interconnection pattern of polycrystalline silicon. Instead of this, the whole pattern of polycrystalline silicon may be previously defined, after which one edge of the zones 5 is defined by the polycrystalline silicon and the other edges are defined by means of an extra mask. In these cases also, at least a part of the zones to be doped are provided in a self-registering manner.

Furthermore, the insulating layer 11 may be provided pyrolytically instead of by thermal oxidation. In order to not reduce the effective thickness of the layer 10 of refractory material too much, the insulating layer 15 may also be formed by a short oxidation succeeded by glass deposition. Materials other than the aluminium mentioned here may also be chosen for the metal layers used.

What is claimed is:
1. A semiconductor device having a semiconductor body comprising:
   a surface-adjoining region of the first conductivity type;
   a current conductor of which at least a part comprises a surface-adjoining strip-shaped semiconductor zone of the second conductivity type;
   at least one surface-adjoining further zone of the second conductivity type on at least one side of the strip-shaped semiconductor zone, which is separated from the strip-shaped semiconductor zone by a part of the region of the first conductivity type and which forms part of a semiconductor element;
   said strip-shaped semiconductor zone, in as far as it forms part of the said part of the current conductor, is covered substantially throughout its surface by a metal and is contacted with said metal layer at least at the ends of the said part of the current conductor, in order to reduce the voltage drop across the said part of the current conductor as much as possible;
   such that at least one conductor track crosses the said part of the current conductor and the said metal layer is interrupted at the area of the crossing, the resulting parts of the metal layer contacting the strip-shaped semiconductor zone at least at their ends, wherein said current conductor further comprises:
   an uninterrupted layer of a refractory conductive material which entirely covers the region of the first conductivity type between the strip-shaped zone and the further zone of the second conductivity type and is separated therefrom by an electrically insulating layer;
   the edges of said layer of refractory conductive material in projection coinciding substantially with at least one edge of said strip-shaped semiconductor zone and with the oppositely located edge of the further semiconductor zone; and
   said layer of the refractory conductive material, at the area of the crossing, being conductively connected to the metal layer and being separated from the crossing conductor track by an insulating layer.

2. A semiconductor device as claimed in claim 1, wherein said refractory material is polycrystalline silicon.

3. A semiconductor device as claimed in claim 1, wherein said refractory material comprises a metal of the group of molybdenum, tungsten and platinum.

4. A semiconductor device as claimed in claim 1, wherein said metal layer is in contact with said strip-shaped semiconductor zone substantially throughout its length.

5. A semiconductor device as claimed in claim 1, wherein said semiconductor body comprises:
further zones of the second conductivity type,
on both sides of the said strip-shaped semiconductor zone of the second conductivity type, said further zones being separated from the strip-shaped semiconductor zone and from each other by parts of the region of the first conductivity type; and
said current conductor comprises two uninterrupted layers of a refractory conductive material on both sides of the strip-shaped semiconductor zone which cover entirely the regions of the first conductivity type between the edges of the strip-shaped semiconductor zone and the edges of the further zones of the second conductivity type.

6. A semiconductor device as claimed in claim 5, wherein at the area of the crossing the two uninterrupted layers of refractory conductive material are connected to form one coherent layer.

7. A semiconductor device as claimed in claim 6, wherein said refractory material forms one coherent layer which is present above substantially the whole region of the first conductivity type.

8. A semiconductor device as claimed in claim 1, wherein said strip-shaped zone forms the emitter zone, the further zones form the collector zones and the parts of the region of the first conductivity type situated between the strip-shaped zone and the further zones form the base zones of lateral injection transistors of a circuit according to the integrated injection logic principle, the further zones of the second conductivity type also forming the base zones of the switching transistors.

9. A semiconductor device as claimed in claim 8, wheren said strip-shaped semiconductor zone is absent, at least partly outside the regions where the current conductor is situated opposite to a further zone of the second conductivity type.

* * * * *